(12) United States Patent
Hao et al.

(10) Patent No.: US 7,532,500 B2
(45) Date of Patent: May 12, 2009

(54) METHOD AND APPARATUS FOR STORING DATA AND METHOD FOR READING DATA

(75) Inventors: Daming Hao, Beijing (CN); Hang Jun Ye, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 11/818,503

(22) Filed: Jun. 14, 2007

(65) Prior Publication Data
US 2008/0034145 A1 Feb. 7, 2008

(30) Foreign Application Priority Data
Jun. 14, 2006 (CN) .................. 2006 1 0091895

(51) Int. Cl.
*G11C 7/00* (2006.01)
(52) U.S. Cl. ...................................... 365/149; 365/148
(58) Field of Classification Search .................. 365/149, 365/148, 189.15, 188
See application file for complete search history.

(56) References Cited

U.S. PATENT DOCUMENTS

| 7,307,572 | B2 * | 12/2007 | Garrity et al. ................ 341/172 |
| 7,358,823 | B2 * | 4/2008 | Abadeer et al. ......... 331/177 V |
| 2007/0165444 | A1 * | 7/2007 | Culver et al. ................. 365/151 |

* cited by examiner

*Primary Examiner*—Vu A Le
(74) *Attorney, Agent, or Firm*—Kenneth R. Corsello; Anne Vachon Dougherty

(57) ABSTRACT

An apparatus and method for storing data, and a method for reading data. The apparatus for storing data of the present invention comprises at least one bridge for storing binary data. Each bridge has four legs and represents a bit with a nonequilibrium state between two juncture points. The apparatus for storing data further comprises at least one comparator respectively connected between the two juncture points of each of the at least one bridge for determining a value of the bit represented by the bridge.

20 Claims, 13 Drawing Sheets

METHOD AND APPARATUS FOR STORING DATA AND METHOD FOR READING DATA

TECHNICAL FIELD OF THE INVENTION

The present invention relates to technology of storing data, in particular, to technology of securely storing data.

BACKGROUND OF THE INVENTION

With the spread of E-business and the Internet, security and creditability problems become increasingly important. To solve these problems and protect secrecy in hardware and software, generally a symmetric key or asymmetric key is used in a Public-Key Infrastructure (PKI). Since the software and hard disk that protects the symmetric key or private key are vulnerable to attack, more and more applications keep such keys in integrated circuit chips, such as a Smartcard, a Trusted Platform Module (TPM), and a Field Programmable Gate Array (FPGA) that protects the Triple Data Encryption Standard (DES) keys. However, most of the approaches are either not secure enough for the hackers who hold professional tools, or too expensive or inconvenient to use.

The following are some traditional methods for protecting encryption keys in integrated circuits and their drawbacks:

Method 1

Store the keys in Application Specific Integrated Circuit (ASIC) chip or embedded read-only memory (ROM). It can be cracked though reverse engineering. Hackers/Crackers take photos of the chip after etching each successive layer and thus can easily read the information.

Method 2

Keep the keys in embedded flash memory. To crack such a chip is more difficult than Method 1, however, it is possible. One approach is to measure the potential of the floating gate electrically. Another approach is to put the powered chip into a vacuum container and measure its radiation with an electron microscope.

Method 3

Protect the keys with QuickLogic's patent ViaLink technology (see EP00416903A2). The ViaLink technology can hide the key in millions of antifuses, so it is difficult for crackers to locate it. Industry experts regard antifuse as the most secure of all programmable logic solutions. However, this technology is mainly used in FPGA and the associated device is expensive.

Method 4

Keep the keys in random access memory (RAM) and charge the RAM with an external battery. With the assistance of an effectively designed sensor, this technology can be regard as secure, but the additional battery constrains its popularization.

Furthermore, for most of the traditional methods, since the memory block is separate from other blocks and the information must be passed along a bus between the blocks, crackers can put a probe on the bus of a powered chip and read the secret.

In addition, traditional memories keep information with digital state, either "0" or "1", so the physical property of the "0" unit is distinct from that of the "1" unit, and thus it is possible for crackers to find the approach to crack it at present or in the future.

SUMMARY OF THE INVENTION

In order to solve the above problems of the prior art, the present invention provides an apparatus and method for storing data and a method for reading data.

According to one aspect of the invention, there is provided an apparatus for storing data, comprising: at least one bridge for storing binary data, wherein each bridge has four legs and represents a bit with a nonequilibrium state between two juncture points; and at least one comparator respectively connected between said two juncture points of each of said at least one bridge for determining a value of said bit represented by said bridge.

According to another aspect of the invention, there is provided a method for storing data, comprising: representing a bit of binary data with a nonequilibrium state of a bridge; and determining a value of said bit represented by said bridge by comparing the nonequilibrium state of said bridge with a comparator.

According to another aspect of the invention, there is provided a method for reading data from an apparatus for storing data, said apparatus for storing data being an apparatus for storing data as described above, said method comprising: applying a voltage to both sides of the bridge; and determining a value of the bit represented by said bridge by comparing the voltage difference between the two juncture points of said bridge with said comparator.

BRIEF DESCRIPTION OF THE DRAWINGS

It is believed that the above features, advantages and objects of the invention will be better understood from the description of the detailed implementation of the invention in conjunction with accompany drawings, in which.

DETAILED DESCRIPTION OF THE PREFERRED EMBODIMENTS

Next, various preferred embodiments of the invention will be described in detail in conjunction with the accompanying drawings.

Figure 1:
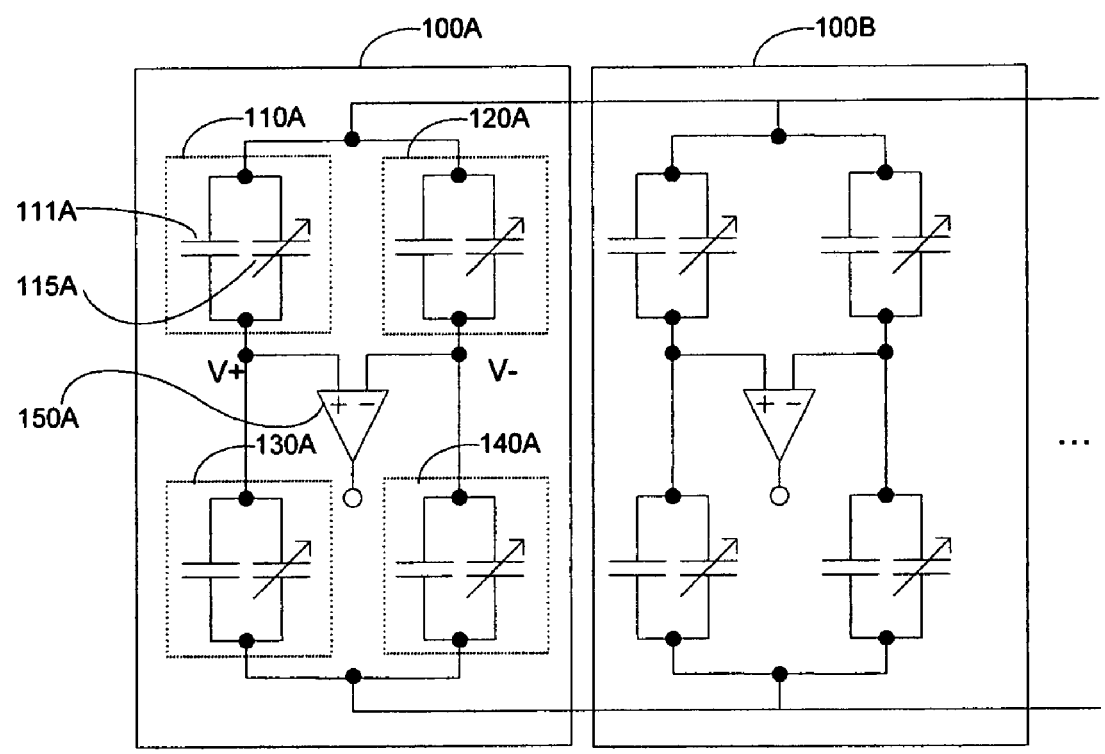
FIG. 1 shows an apparatus for storing data that comprises capacitive bridges according to one embodiment of the invention.

FIG. 1 shows an apparatus for storing data that comprises capacitive bridges according to one embodiment of the invention. Next, the embodiment will be described in conjunction with FIG. 1.

In FIG. 1, at least one bridge 100A, 100B, ..., 100N is shown. The structure of each bridge is essentially the same. Bridge 100A is an example which is described hereinafter in detail.

Bridge 100A has four legs 110A, 120A, 130A, 140A, in which the connection point of two legs 110A, 130A forms one juncture point of bridge 100A and the connection point of another two legs 120A, 140A forms another juncture point of bridge 100A. In the present embodiment, a bit (i.e., '0' or '1') of binary data is represented with a nonequilibrium state between the two juncture points. The present invention has no limitation to the selection of the two juncture points, that is, a bit (i.e., '0' or '1') of binary data can be represented with a nonequilibrium state between one juncture point that is formed by the connection point of two legs 110A, 120A of bridge 100A and another juncture point that is formed by the connection point of two legs 130A, 140A. In addition, the present invention has no limitation to the structure of each leg, which can contain one or more elements. In the case that there are a plurality of elements in each leg, these elements can be connected together in series, in parallel or in a combination of such connections.

The four legs 110A, 120A, 130A, 140A of bridge 100A are all configuration legs. The structure of each configuration leg is essentially the same. Configuration leg 110A is used as an example to describe the embodiment in detail.

Configuration leg 110A has a fixed capacitor 111A and an adjustable capacitor 115A connected in parallel. Preferably, the capacitance of the adjustable capacitor 115A is much less than that of the fixed capacitor 111A. In addition, the capacitors can be metal-metal capacitors, metal-polysilicon capacitors or polysilicon-polysilicon capacitors. Preferably, the capacitor is a metal-metal capacitor.

Furthermore, a comparator 150A is connected between the above two juncture points of bridge 100A, that is, between the connection point of configuration legs 110A, 130A and the connection point of configuration legs 120A, 140A. The comparator is used to compare the voltage difference between the above two juncture points of bridge 110A, thereby determining a value of the bit represented by bridge 100A.

Figure 3:
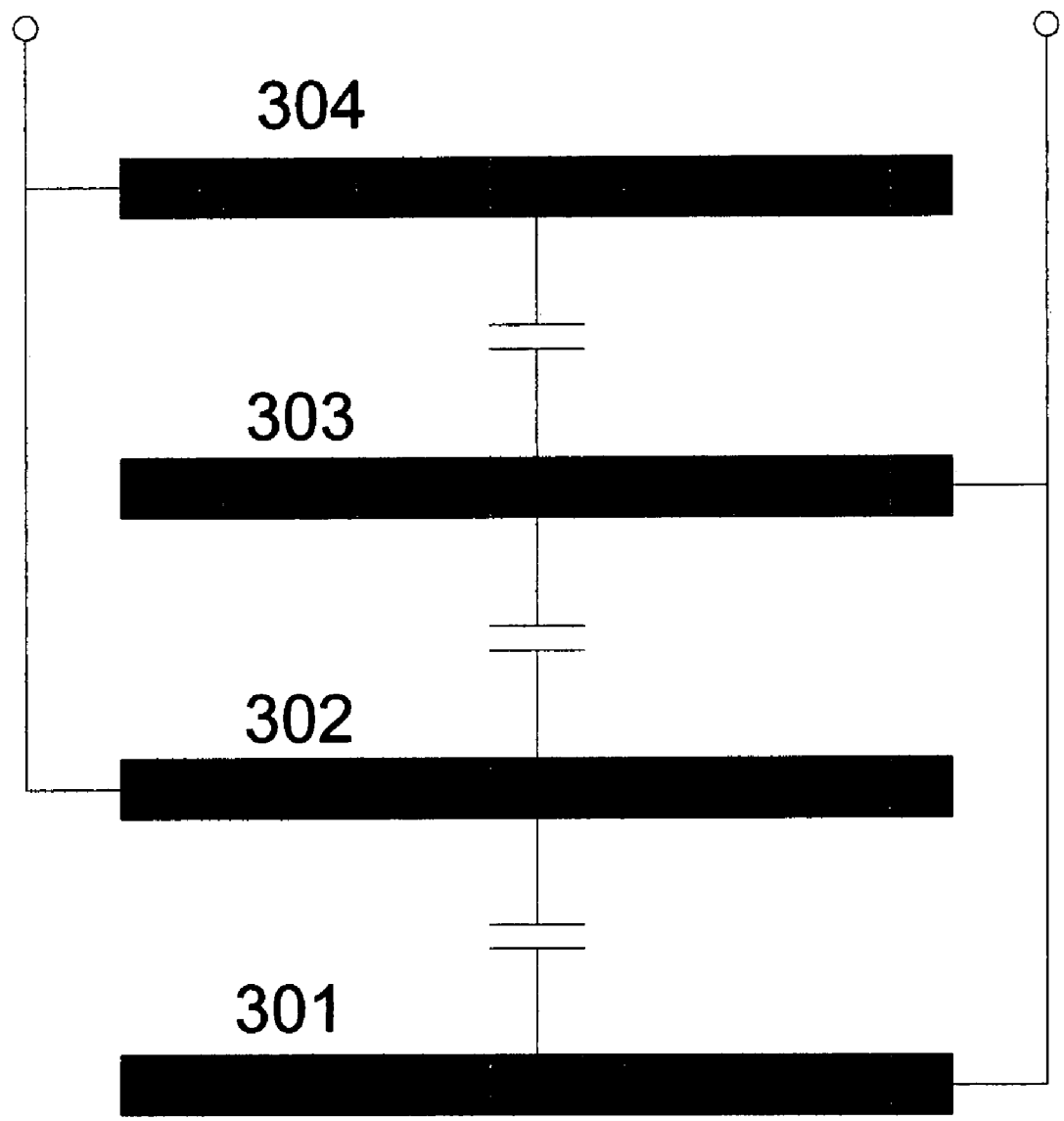
FIG. 3 shows an example of a fixed capacitor used in the apparatus for storing data according to one embodiment of the invention.

FIG. 3 shows an example of a fixed capacitor 111A used in the apparatus for storing data according to one embodiment of the invention. In FIG. 3, the fixed capacitor 111A is a metal-metal capacitor that uses a multifinger structure, in which metal plate 301 and metal plate 302 forms one capacitor, metal plate 302 and metal plate 303 forms one capacitor, and metal plate 303 and metal plate 304 forms one capacitor. These three capacitors are connected in parallel to from the fixed capacitor 111A. In addition, each fixed capacitor 111A can have the same or a different structure, but preferably the capacitors have approximately equal capacitance.

Figure 4:
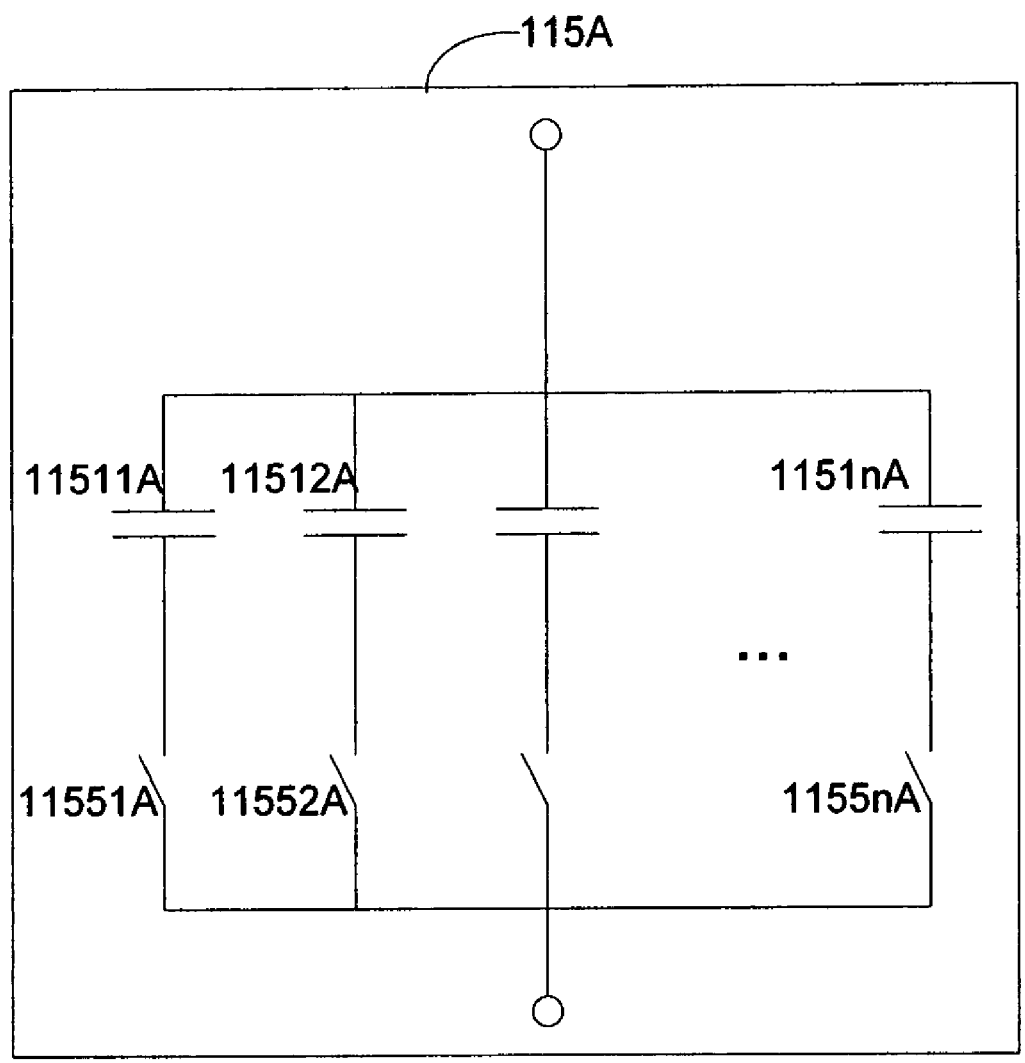
FIG. 4 shows an example of an adjustable capacitor used in the apparatus for storing data according to one embodiment of the invention.

FIG. 4 shows an example of an adjustable capacitor 115A used in the apparatus for storing data according to one embodiment of the invention. In FIG. 4, the adjustable capacitor 115A comprises a plurality of configuration capacitors 11511A, 11512A, ..., 1151nA connected in parallel. Each configuration capacitor 11511A, 11512A, ..., 1151nA can be controlled by switches 11551A, 11552A, ..., 1155nA connected in series. In addition, each configuration capacitor 11511A, 11512A, ..., 1151nA can have the same or different capacitance as the other capacitors.

The switches 11551A, 11552A, ..., 1155nA in FIG. 4 can be fuses that are used in a traditional PROM. Thus, the switches can be controlled by melting the fuses to adjust the capacitance of the adjustable capacitor 115A, thereby adjusting the nonequilibrium state of bridge 100A, so as to use bridge 100A to represent binary data '0' or '1'.

Optionally, switches 11551A, 11552A, ..., 1155nA may also be field effect transistor (FET) switches, preferably, metal oxide semiconductor field effect transistor (MOSFET) switches. Thus, the apparatus for storing data can further comprises a control unit for adjusting the nonequilibrium state of said bridge by controlling said switch in order to write data. The apparatus for storing data that includes a control unit will be described in conjunction with other embodiments and accompany drawings hereinafter.

In the present embodiment, the nonequilibrium state between the two juncture points of bridge 100A is changed by altering the capacitance of the adjustable capacitor of configuration leg 110A, 120A, 130A, 140A (e.g. the adjustable capacitor 115A of configuration leg 110A), thereby representing binary data '0' or '1'.

Figure 5:
FIG. 5 shows the threshold range of the voltage difference between two juncture points of the bridge that is used to represent binary data '0' and '1' in the apparatus for storing data according to one embodiment of the invention.

FIG. 5 shows the threshold range of the voltage difference between two juncture points of the bridge that is used to represent binary data '0' and '1' in the apparatus for storing data according to one embodiment of the invention.

In FIG. 5, when a voltage of 2.5V-5V (preferably, 3V-3.3V) is applied to both sides of bridge 100A, the threshold range is generally between [±1 mV, ±1 mV], but due to variations in processing environment and comparison precision, the threshold range can take a certain interval, for example, [±0.1 mV, ±0.2 mV] or [±0.5 mV, ±1 mV], and the present invention has no limitation to this. In the present embodiment, preferably the first threshold range [−Vth2, −Vth1] is [−0.3 mV, −0.15 mV], and the second threshold range [Vth1, Vth2] is [0.15 mV, 0.3 mV]. The nonequilibrium state of the bridge represents '0' when the voltage difference between the two juncture points of bridge 100A falls within the first threshold range. The nonequilibrium state of the bridge represents '1' when the voltage difference between the two juncture points of bridge 100A falls within the second threshold range. In addition, the threshold ranges corresponding to '0' and '1' are interchangeable.

It should be noted that the voltage difference between the two juncture points of bridge 100A should be set to an appropriate range, preferably between ±0.15 mV and ±0.3 mV. If the voltage difference is too large, the data stored in the apparatus for storing data will be more susceptible to being cracked. If the voltage difference is too small, the stability of the bridge will be affected. In the present embodiment, the voltage difference is preferably ±0.3 mV.

In the present embodiment, a bit (i.e., '0' or '1') of binary data is represented with a nonequilibrium state of one of the at least one bridge 100A, 100B, ..., 100N as shown in FIG. 1. In practice, the bridges can also be divided into groups to act as multiple storage units, and one or more bridges can also be used as a parity bit. The present invention has no limitation in this regard.

From the above it can be seen that the apparatus for storing data of the present embodiment has the following advantages:

(1) The apparatus for storing data of the present embodiment uses a nonequilibrium state of a capacitive bridge to store '0' and '1'. In the capacitive bridge, the capacitance of a capacitor not only depends on its area, but also depends on the distance of the two electrodes and the surrounding circumstances. Since the distance of the two electrodes and the effect of the surrounding circumstances are difficult to measure, and the distance of the two electrodes varies at different positions of a chip, it is almost impossible for crackers to decide the state of the bridge through a photograph of the layout.

(2) The nonequilibrium state of the bridge in the apparatus for storing data of the present embodiment is hardly affected by the power source and the temperature, so the apparatus for storing data of the present embodiment is robust.

(3) The techniques and processes involved in the apparatus for storing data of the present embodiment are mature and have been validated by many kinds of products.

(4) The area consumption, power consumption, speed and cost of the bridge in the apparatus for storing data of the present embodiment are all acceptable.

(5) Compared with most of the traditional methods, it is much more secure to store keys in this apparatus for storing data of the present embodiment. The present technology not only avoids retrieving the secret by reverse engineering, but also prevents crackers from measuring the bus with a probe.

(6) In the apparatus for storing data of the present embodiment, since the voltage difference between the two juncture points of the bridge is set to a relatively small value, the voltage difference can only be measured by the comparator integrated on the chip and could not be measured via external comparators, so security is increased.

(7) The process involved in the apparatus for storing data of the present embodiment is compatible with standard CMOS processing, and the apparatus for storing data can be integrated with other blocks (e.g. MCU) in a single chip.

(8) The apparatus for storing data of the present embodiment does not need an external battery, so this technology has good portability and can be used in a Smartcard, a TPM chip or another security chip.

Figure 2:
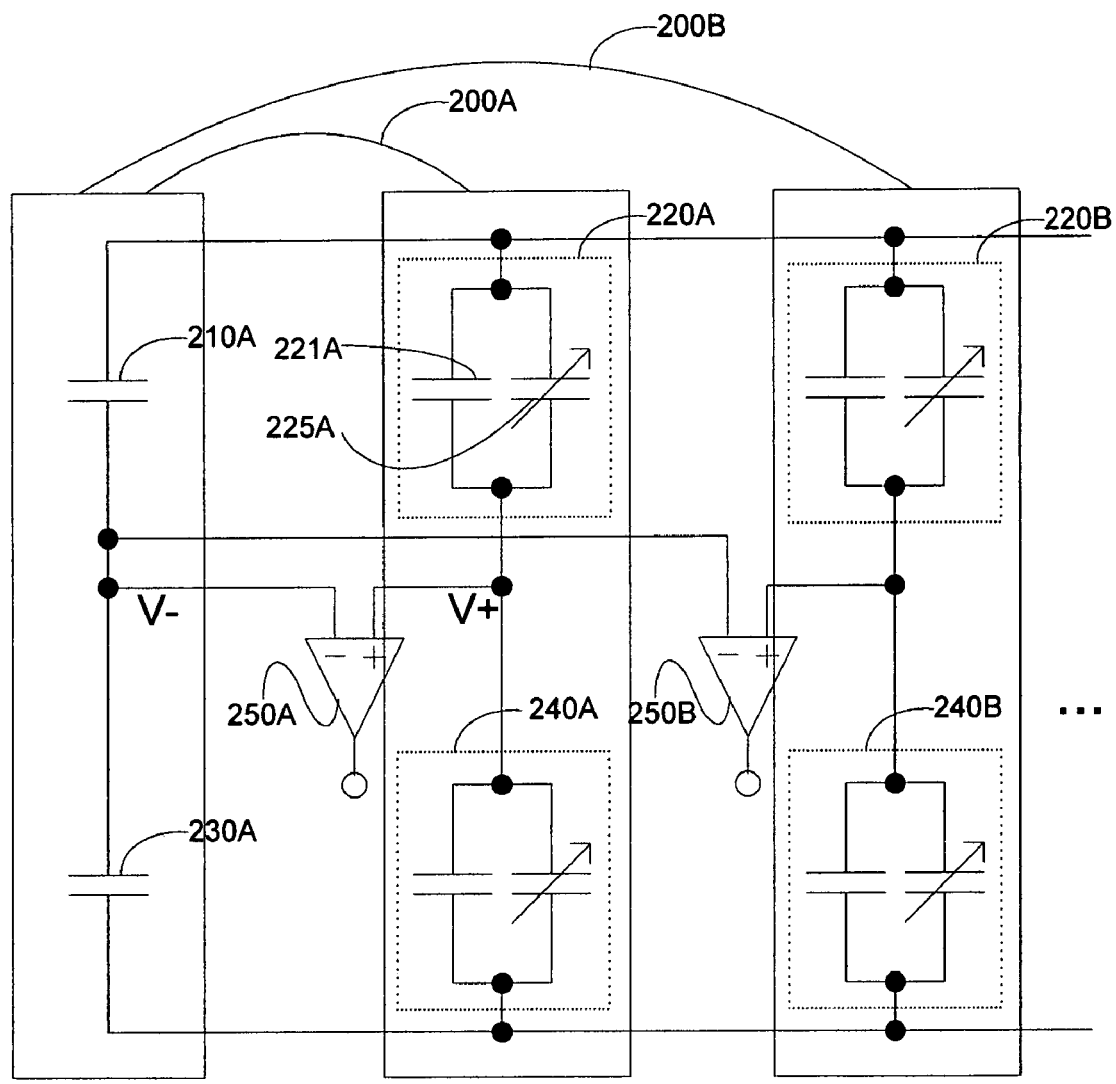
FIG. 2 shows an apparatus for storing data that comprises capacitive bridges according to another embodiment of the invention.

FIG. 2 shows an apparatus for storing data that comprises capacitive bridges according to another embodiment of the invention. Next, the embodiment will be described in conjunction with FIG. 2. For those parts that have already been described for the foregoing embodiment, a further description will be omitted.

In FIG. 2, at least one bridge 200A, 200B, . . . , 200N is shown, wherein each bridge shares two legs with other bridges. The structure of each bridge is essentially the same. Next we take bridge 200A as an example to describe the embodiment in detail.

Bridge 200A has four legs 210A, 220A, 230A, 240A, in which the connection point of two legs 210A, 230A forms one juncture point of bridge 200A, these two legs 210A, 230A are shared by other bridges 200B, . . . , 200N. The connection point of another two legs 220A, 240A forms another juncture point of bridge 200A. In the present embodiment, a bit (i.e., '0' or '1') of binary data is represented with a nonequilibrium state between the two juncture points.

The two legs 220A, 240A of bridge 200A that are not shared are configuration legs. The structure of each configuration leg is essentially the same. Next we take configuration leg 220A as an example to describe the embodiment in detail.

Configuration leg 220A has a fixed capacitor 221A and an adjustable capacitor 225A connected in parallel. Preferably, the capacitance of the adjustable capacitor 225A is much less than that of the fixed capacitor 221A. In addition, each capacitor can be a metal-metal capacitor, a metal-polysilicon capacitor or a polysilicon-polysilicon capacitor. Preferably, the capacitor is a metal-metal capacitor.

Furthermore, a comparator 250A is connected between the above two juncture points of bridge 200A, that is, between the connection point of legs 210A, 230A and the connection point of configuration legs 220A, 240A. The comparator 250A is used to compare the voltage difference between the above two juncture points of bridge 200A, thereby determining a value of the bit represented by bridge 200A. Similarly, a comparator 250B is connected between two juncture points of bridge 200B, that is, between the connection point of legs 210A, 230A and the connection point of configuration legs 220B, 240B. The comparator 250B is used to compare the voltage difference between the above two juncture points of bridge 200B, thereby determining a value of the bit represented by bridge 200B.

The capacitive bridge of the apparatus for storing data of the present embodiment differs from that of the apparatus for storing data of the above embodiment in that, in the present embodiment, all the bridges share two legs. Thus, the structure of the capacitive bridge can be simplified by employing the apparatus for storing data of the present embodiment, thereby further reducing area consumption, power consumption and the cost of the bridge. Moreover, the present embodiment has all the advantages (1) to (8) of the above embodiment.

Figure 6:
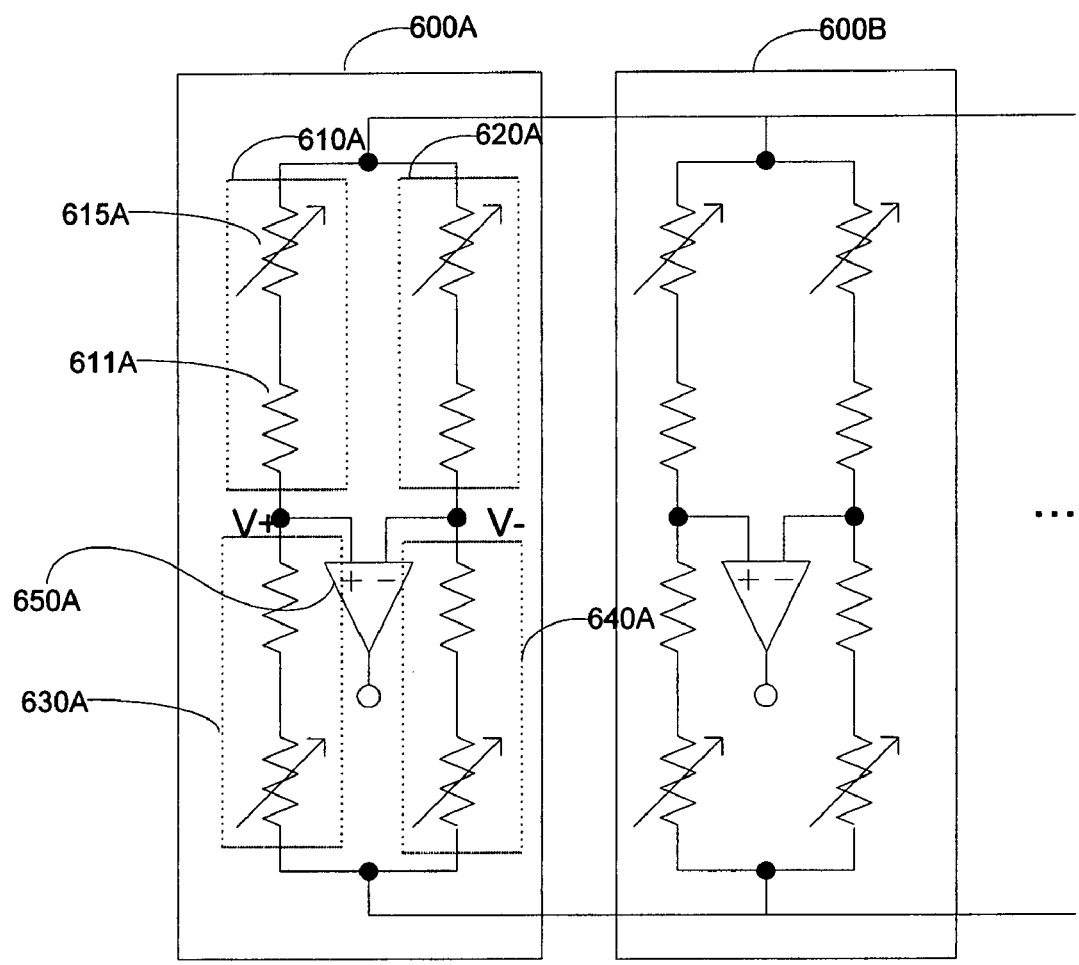
FIG. 6 shows an apparatus for storing data that comprises resistance bridges according to still another embodiment of the invention.

FIG. 6 shows an apparatus for storing data that comprises resistance bridges according to still another embodiment of the invention. Next, the embodiment will be described in conjunction with FIG. 6. For those same parts as have been detailed for the above embodiment(s), the description will not be repeated.

In FIG. 6, at least one bridge 600A, 600B, . . . , 600N is shown, in which the structure of each bridge is essentially the same. Next we take bridge 600A as an example to describe the embodiment in detail.

Bridge 600A has four legs 610A, 620A, 630A, 640A, in which the connection point of two legs 610A, 630A forms one juncture point of bridge 600A, the connection point of another two legs 620A, 640A forms another juncture point of bridge 600A. In the present embodiment, a bit (i.e., '0' or '1') of binary data is represented with a nonequilibrium state between the two juncture points. The present invention has no limitation to the selection of the two juncture points, that is, a bit (i.e., '0' or '1') of binary data can be represented with a nonequilibrium state between one juncture point that is formed by the connection point of two legs 610A, 620A and another juncture point that is formed by the connection point of two legs 630A, 640A of bridge 600A. In addition, the present invention has no limitation to the structure of each leg.

The four legs 610A, 620A, 630A, 640A of bridge 600A are all configuration legs, in which the structure of each configuration leg is essentially the same. Next we take configuration leg 610A as an example to describe the embodiment in detail.

Configuration leg 610A has a fixed resistor 611A and an adjustable resistor 615A connected in series. Preferably, the resistance of the adjustable resistor 615A is much less than that of the fixed resistor 611A. Additionally, each fixed resistor can have the same or a different structure, but preferably the resistors have approximately equal resistance. In addition, all the resistors can be metal resistors, polysilicon resistors or high resistance polysilicon resistors.

Furthermore, a comparator 650A is connected between the above two juncture points of bridge 600A, that is, between the connection point of configuration legs 610A, 630A and the connection point of configuration legs 620A, 640A. The comparator 650A is used to compare the voltage difference between the above two juncture points of bridge 600A, thereby determining a value of the bit represented by bridge 600A.

Figure 8:
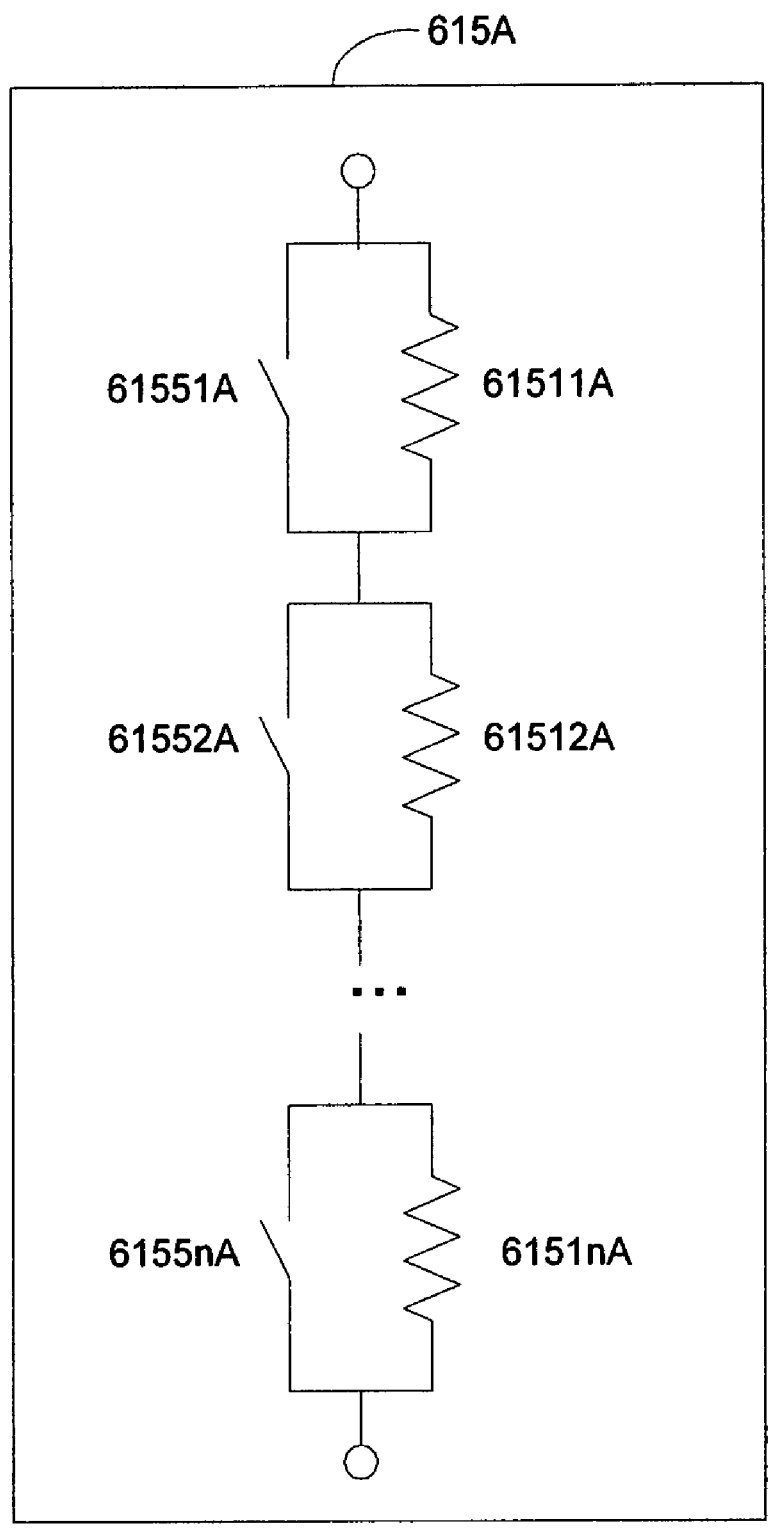
FIG. 8 shows an example of an adjustable resistor used in the apparatus for storing data according to one embodiment of the invention.

FIG. 8 shows an example of an adjustable resistor 615A used in the apparatus for storing data according to one embodiment of the invention. In FIG. 8, the adjustable resistor 615A comprises a plurality of configuration resistors 61511A, 61512A, . . . , 6151nA connected in series. Each configuration resistor 61511A, 61512A, . . . , 6151nA can be controlled by switches 61551A, 61552A, . . . , 6155nA connected in parallel. In addition, each configuration resistor 61511A, 61512A, . . . , 6151nA can have the same or different resistance.

The switches 61551A, 61552A, . . . , 6155nA in FIG. 8 can be fuses that are used in a traditional PROM. Thus, the switches can be controlled by melting the fuses to adjust the resistance of the adjustable resistor 615A, thereby adjusting the nonequilibrium state of bridge 600A, so as to use bridge 600A to represent binary data '0' or '1'.

Optionally, switches 61551A, 61552A, . . . , 6155nA may also be field effect transistor (FET) switches, preferably, metal oxide semiconductor field effect transistor (MOSFET) switches. Thus, the apparatus for storing data can further comprises a control unit for adjusting the nonequilibrium state of the bridge by controlling the switch in order to write data. The apparatus for storing data that includes a control unit will be described in conjunction with other embodiments and accompanying drawings hereinafter.

In the present embodiment, the nonequilibrium state between the two juncture points of bridge 600A is changed by altering the resistance of the adjustable resistor of configuration leg 610A, 620A, 630A, 640A (e.g. the adjustable resistor 615A of configuration leg 610A), thereby representing binary data '0' or '1'.

The apparatus for storing data of the present embodiment differs from that of the embodiment shown in FIG. 1 in that, in the present embodiment, a resistance bridge is substituted for the capacitive bridge in the above embodiment. Thus, in addition to the above advantages (2) to (7), the apparatus for storing data of the present embodiment further has the following advantage: the apparatus for storing data of the present embodiment uses a nonequilibrium state of a resistance bridge to store '0' and '1'. In the resistance bridge, the resistance of a resistor not only depends on its width and length, but also depends on its thickness and figure. Since the thickness and the effect of figure are difficult to measure, and the thickness varies at different positions on a chip, it is almost impossible for crackers to determine the state of the bridge through a photograph of the layout.

Figure 7:
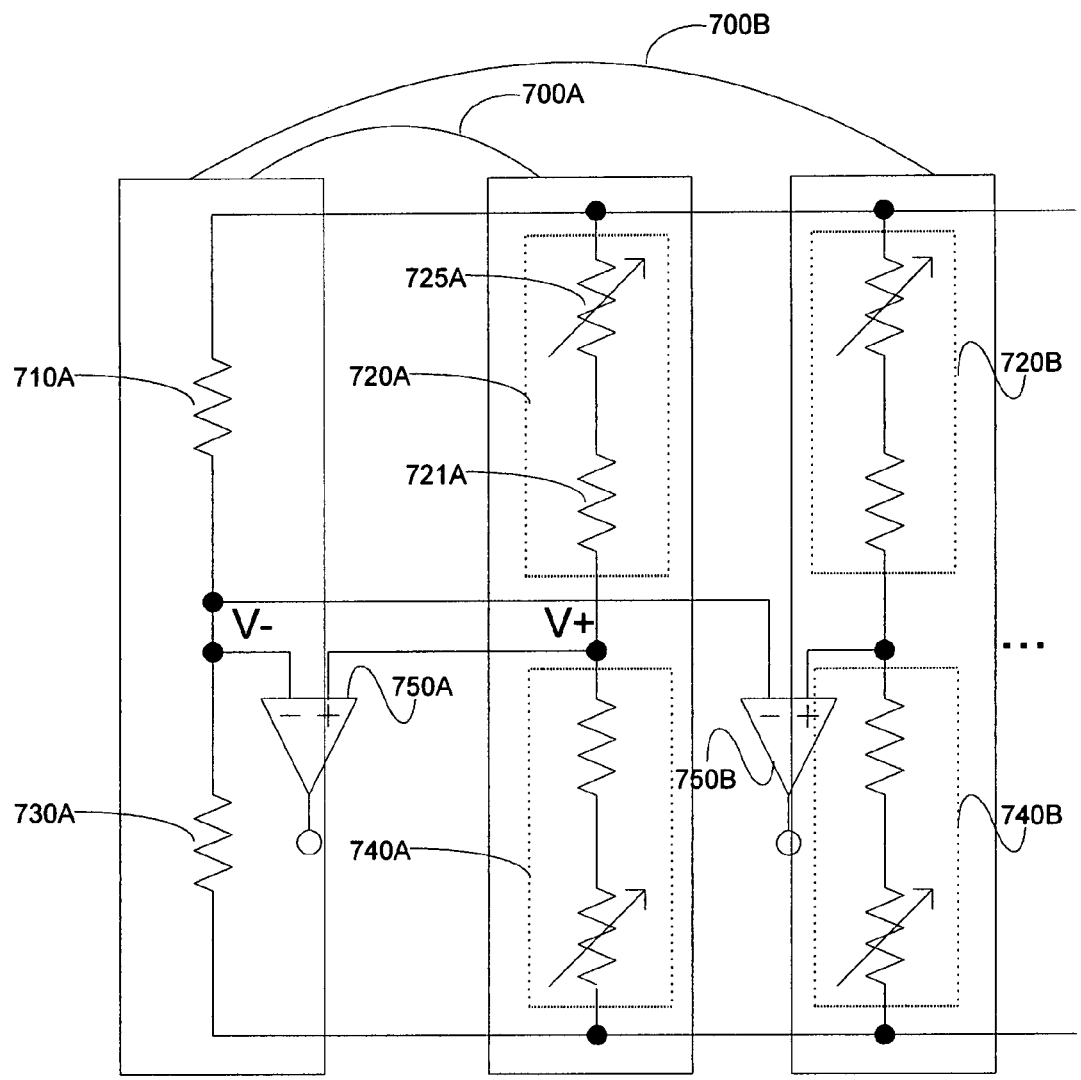
FIG. 7 shows an apparatus for storing data that comprises resistance bridges according to yet another embodiment of the invention.

FIG. 7 shows an apparatus for storing data that comprises resistance bridges according to still another embodiment of the invention. Next, the embodiment will be described in conjunction with FIG. 7. For those same parts as have been detailed with respect to the above embodiment(s), the description will not be repeated.

In FIG. 7, at least one bridge 700A, 700B, . . . , 700N is shown, wherein each bridge shares two legs with other bridges, the structure of each bridge being essentially the same. Bridge 700A will be taken as an example to be described in detail.

Bridge 700A has four legs 710A, 720A, 730A, 740A, in which the connection point of two legs 710A, 730A forms one juncture point of bridge 700A, these two legs 710A, 730A are shared by other bridges 700B, . . . , 700N. The connection point of another two legs 720A, 740A forms another juncture point of bridge 700A. In the present embodiment, a bit (i.e., '0' or '1') of binary data is represented with a nonequilibrium state between the two juncture points.

The two legs 720A, 740A of bridge 700A that are not shared are configuration legs, in which the structure of each configuration leg is essentially the same. Next configuration leg 720A is taken as an example to describe the embodiment in detail.

Configuration leg 720A has a fixed resistor 721A and an adjustable resistor 725A connected in series. Preferably, the resistance of the adjustable resistor 725A is much less than that of the fixed resistor 721A. Additionally, each fixed resistor can have the same or a different structure, but preferably the resistors have approximately equal resistance. In addition, all the resistors can be metal, polysilicon or high resistance polysilicon resistors.

Furthermore, a comparator 750A is connected between the above two juncture points of bridge 700A, that is, between the connection point of legs 710A, 730A and the connection point of configuration legs 720A, 740A. The comparator 750A is used to compare the voltage difference between the above two juncture points of bridge 700A, thereby determining a value of the bit represented by bridge 700A. Similarly, a comparator 750B is connected between two juncture points of bridge 700B, that is, between the connection point of legs 710A, 730A and the connection point of configuration legs 720B, 740B. The comparator 750B is used to compare the voltage difference between the above two juncture points of bridge 700B, thereby determining a value of the bit represented by bridge 700B.

The apparatus for storing data of the present embodiment that comprises resistance bridges differs from the apparatus for storing data of the above embodiment that comprises resistance bridges in that, in the present embodiment, all the bridges share two legs. Thus, the structure of the resistance bridge can be simplified by employing the apparatus for storing data of the present embodiment, thereby further reducing area consumption, power consumption and cost of the bridge. Moreover, the present embodiment has all of the advantages of the embodiment shown in FIG. 6.

Figure 9:
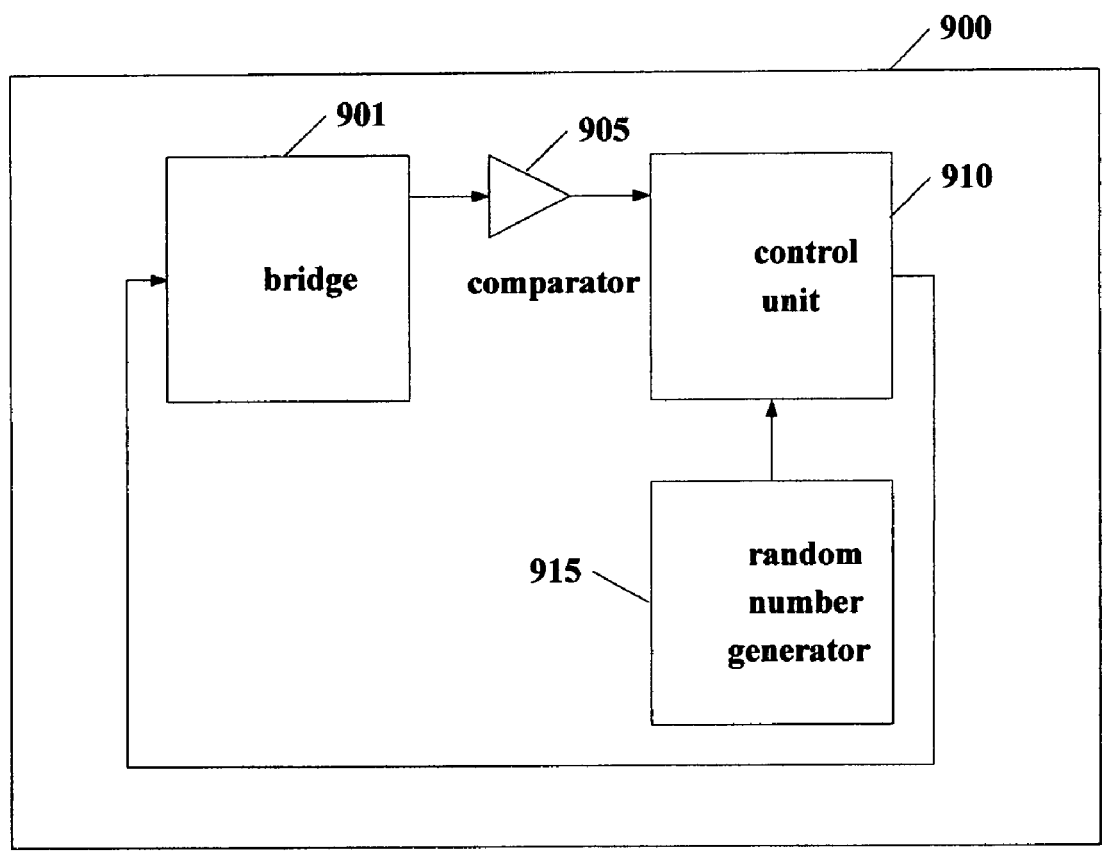
FIG. 9 shows a schematic diagram of an apparatus for storing data according to yet another embodiment of the invention.

FIG. 9 shows a schematic block diagram of an apparatus for storing data according to yet another embodiment of the invention. Next, the embodiment will be described in conjunction with FIG. 9. For those same parts as have been described for the above embodiment(s), the description will be omitted.

The apparatus for storing data 900 of the present embodiment that is schematically shown in FIG. 9 comprises at least one bridge 901, wherein each bridge has four legs and represents a bit with a nonequilibrium state between two juncture points. The at least one bridge 901 may be, for example, the at least one capacitive bridge 100A, 100B, . . . , 100N in the above embodiment, or can be other bridges. The apparatus for storing data 900 further comprises at least one comparator 905 respectively connected between said two juncture points of each of said at least one bridge for determining a value of said bit represented by said bridge. The at least one comparator 905 may be, for example, the at least one comparator 150A, 150B, 150N in the above embodiment, or can be another comparator.

In addition, the apparatus for storing data 900 further comprises a control unit 910 for writing data by controlling the nonequilibrium state of said bridge; and a random number generator 915 for generating a random number to randomly control the on/off of the switches in said bridge through said control unit 910.

Next, the detailed writing process of the apparatus for storing data 900 of the present embodiment will be described in detail, given the at least one capacitive bridge 100A, 100B, ..., 100N in the embodiment shown in FIG. 1 as an example.

(1) With the help of the random number generator 915, the control unit 910 randomly turns off (or turns on) certain switches of the adjustable capacitors of configuration legs 110A, 120A, 130A, 140A of bridge 100A, for example, switches 11551A, 11552A, ..., 1155nA of adjustable capacitor 115A.

(2) In case a voltage is applied to both sides of the bridge 100A, the control unit 910 continues to turn off (or turn on) the switches of adjustable capacitors of configuration legs 110A, 120A, 130A, 140A of bridge 100A (the selection of the switch is still random) according to the output of comparator 150A, so as to make the state of the bridge 100A equal to the set value. That is, when a voltage of 2.5V-5V (preferably, 3V-3.3V) is applied to both sides of bridge 100A, the voltage difference between the two juncture points of bridge 100A falls within the range shown in FIG. 5. Specifically, the nonequilibrium state of the bridge represents '0' when the voltage difference between the two juncture points of bridge falls within a first threshold range. The nonequilibrium state of the bridge represents '1' when the voltage difference between the two juncture points of bridge falls with a second threshold range.

(3) The above processes are repeated to set the nonequilibrium state of other bridges 100B, ..., 100N.

With the apparatus for storing data 900 of the present embodiment, it not only has all the advantages of the embodiment shown in FIG. 1, but has more advantages. Since the turning off of the switch is random, the measurement result of one apparatus for storing data is not applicable to another apparatus for storing data, so it is impossible for crackers to measure one apparatus for storing data and use the result to crack another apparatus for storing data.

Similarly, the foregoing is also applicable to the embodiment shown in FIGS. 2, 6 and 7.

Figure 10:
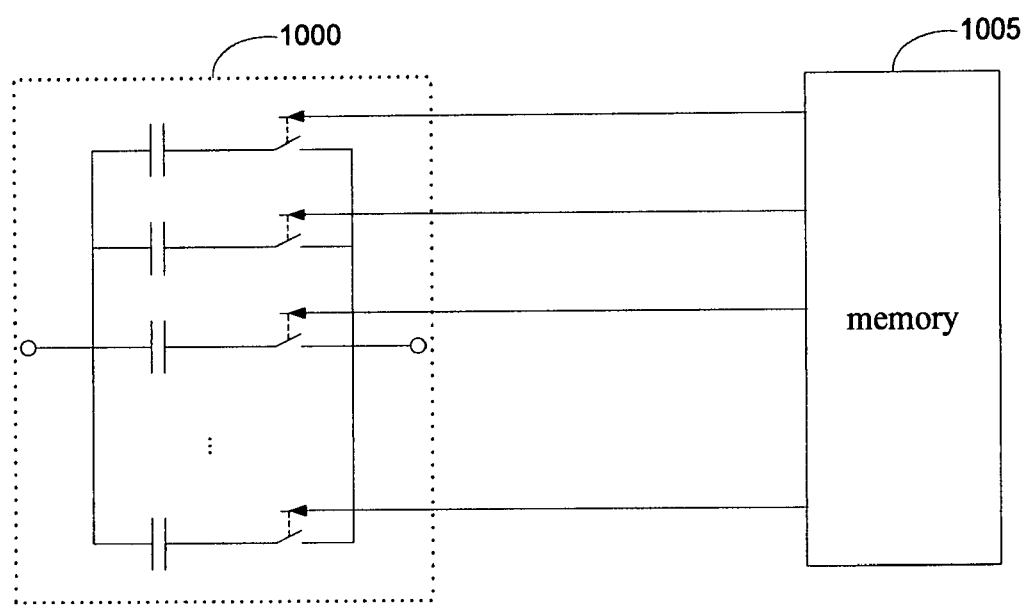
FIG. 10 is a diagram of part of circuit in the apparatus for storing data according to one embodiment of the invention.

FIG. 10 is a diagram of part of a circuit in the apparatus for storing data according to one embodiment of the invention. The apparatus for storing data of the present embodiment can be any apparatus for storing data of the above embodiment. Here it will be described by taking the above apparatus for storing data that comprises a capacitive bridge (as shown in FIG. 1) as an example.

In FIG. 10, each switch (e.g., switch 11551A, 11552A, ..., 1155nA) of adjustable capacitor 1000 (e.g., adjustable capacitor 115A) of each configuration leg of each bridge can be controlled through each bit of the memory, for example, a 1×N bit flash memory 1005. In the present embodiment, each bit of the flash memory 1005, that is, each memory unit, can be directly connected to each switch or can be connected to each switch via a register.

With the apparatus for storing data of the present embodiment, it not only has all the advantages of the embodiment shown in FIG. 1, but also, since the switch (e.g., a MOSFET switch) can be controlled via the memory (e.g., a flash memory), the data in the apparatus for storing data is erasable and the security feature of the flash memory will help to enhance the security of the apparatus for storing data of the present embodiment.

Similarly, the present embodiment is also applicable to the embodiment shown in FIGS. 2, 6 and 7.

Figure 11:
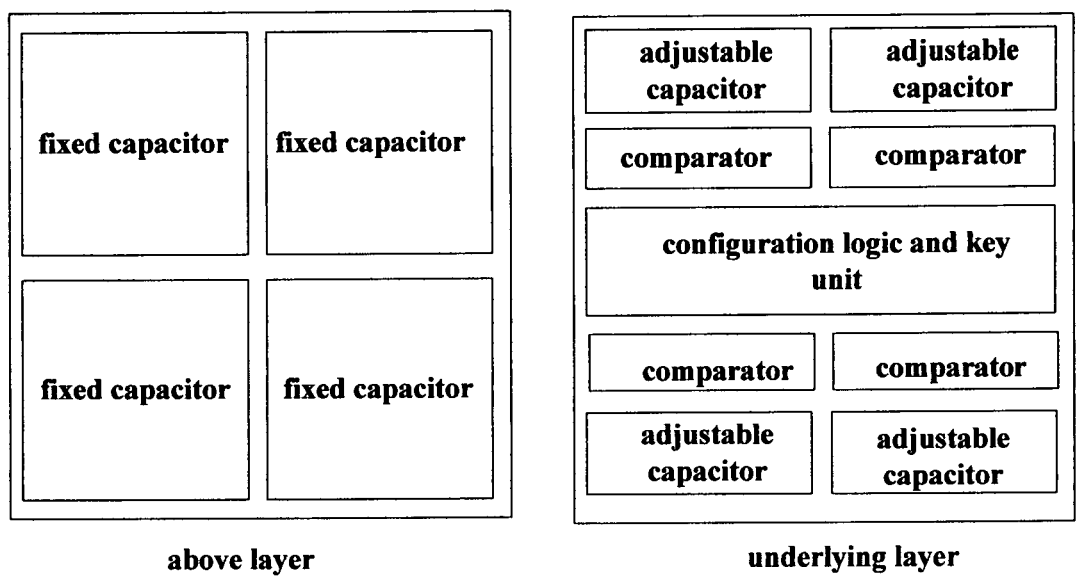
FIG. 11 shows an integrated circuit layout of the apparatus for storing data according to one embodiment of the invention.

FIG. 11 shows an integrated circuit layout of the apparatus for storing data according to one embodiment of the invention. The apparatus for storing data of the present embodiment can be any apparatus for storing data of the above embodiment, here it will be described by taking the above apparatus for storing data that comprises a capacitive bridge (as shown in FIG. 1) as an example.

As shown in FIG. 11, in implementation, the fixed capacitor can cover the adjustable capacitor, comparator, configuration logic and key unit, etc. By using this structure, if crackers etch (including selective etching) the above layer that composes the fixed capacitor and probe the bus, the structure of the bridge will be destroyed and the nonequilibrium state may change, making any measurement result meaningless.

With the apparatus for storing data of the present embodiment, it not only has all the above advantages, but also additional advantages. In order to measure the voltage of a data point, crackers have no alternative but to etch the above layer that composes the fixed capacitor. Further, since the adjustable capacitor, comparator, configuration logic and key unit are covered by the fixed capacitor, the state of the bridge will change and any subsequent measurement result will be meaningless. Even though the fixed capacitor is not damaged, the parasitic capacitance introduced by the probe will affect the measurement result indefinitely.

Figure 12:
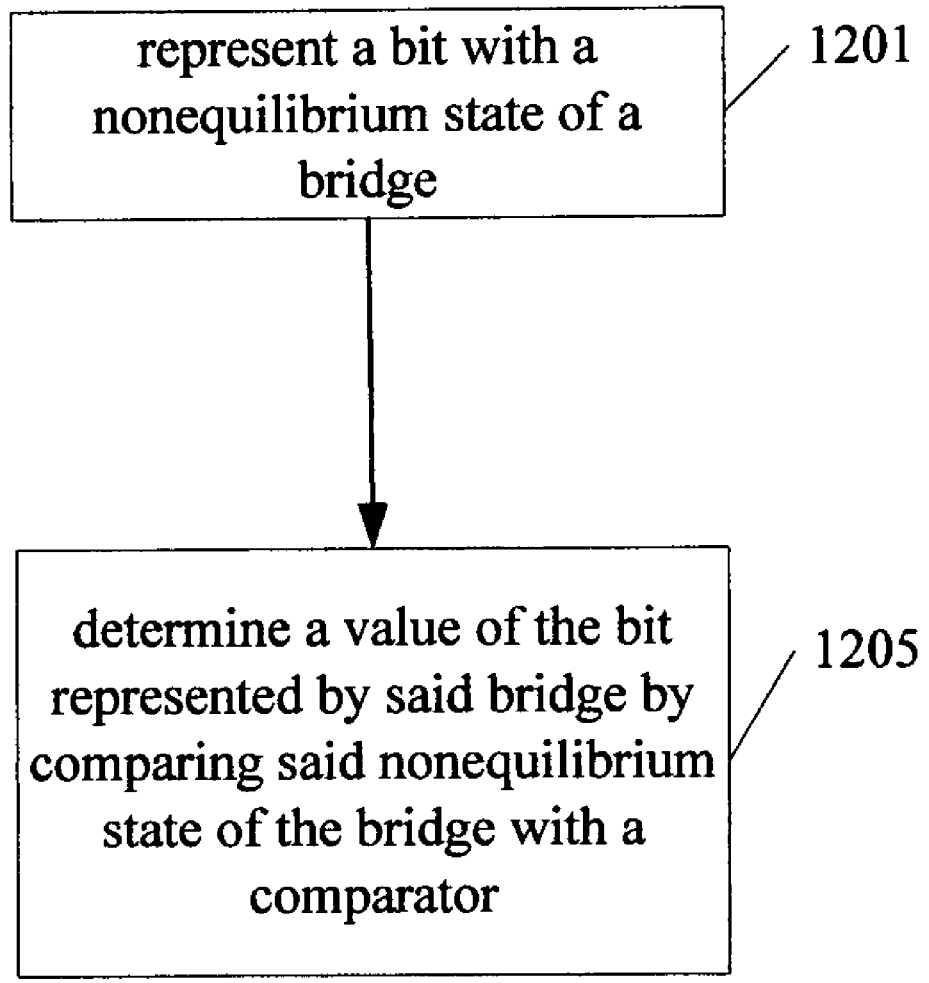
FIG. 12 shows a flowchart of a method for storing data according to one embodiment of the invention.

Under the same inventive conception, FIG. 12 is a flowchart of a method for storing data according to one embodiment of the invention. Next, the embodiment will be described in conjunction with FIG. 12. As shown in FIG. 12, first at step 1201, a bit of binary data is represented with a nonequilibrium state of a bridge.

In the present embodiment, the bridge can be the capacitive bridge used in the apparatus for storing data detailed above, the capacitive bridge including configuration legs; the configuration legs comprise a fixed capacitor and an adjustable capacitor connected in parallel. At step 1201, a bit is represented with the bridge by adjusting the capacitance of the adjustable capacitor of the configuration legs of each bridge in order to change the nonequilibrium state (i.e., voltage difference) between two juncture points of the bridge. Preferably, the adjustable capacitor comprises a plurality of configuration capacitors connected in parallel, and the configuration capacitors are connected in series with switches. At step 1201, the capacitance of the adjustable capacitors is changed by controlling the switches.

In the capacitive bridge the switch can be a fuse. At step 1201, the nonequilibrium state of the bridge is adjusted, for example by melting the fuse to control the switch.

Optionally, the switch can be a field effect transistor (FET) switch, or more preferably a metal oxide semiconductor field effect transistor (MOSFET) switch. In the FET or MOSFET switch embodiments, at step 1201 the nonequilibrium state of the bridge is adjusted by controlling the on/off of the FET or MOSFET switch through a control unit. The detailed adjusting process is similar to that described above in conjunction with FIG. 9.

Next, at step 1205, a value of the bit represented by the bridge is determined by comparing the nonequilibrium state of each bridge with a comparator. In particular, at step 1205, when a voltage of 2.5V-5V (preferably, 3V-3.3V) is applied to both sides of bridge, the voltage difference between the two juncture points of each bridge is compared with the comparator, the bridge represents '0' if the voltage difference of the bridge falls within a first threshold range [−0.3 mV, −0.15 mV], otherwise, the bridge represents '1' when the voltage difference of the bridge falls within a second threshold range [0.15 mV, 0.3 mV]. In addition, the threshold ranges corresponding to '0' and '1' are interchangeable.

By storing keys with the method for storing data that use bridges of the present embodiment, the following advantages are realized.

(1) In the method for storing data of the present embodiment, a nonequilibrium state of a capacitive bridge is used to store '0' and '1'. In the capacitive bridge, the capacitance of a capacitor not only depends on its area, but also depends on the distance of the two electrodes and the surrounding conditions. Since the distance of the two electrodes and the effect of surrounding conditions are difficult to measure, and the distance of the two electrodes varies at different positions of a chip, it is almost impossible for crackers to decide the state of the bridge through a photograph of the layout.

(2) In the method for storing data of the present embodiment, the nonequilibrium state of the bridge is hardly affected by the power source and the temperature, so the method for storing data of the present embodiment is robust.

(3) The techniques and processes involved in the method for storing data of the present embodiment are mature and have been validated by many kinds of products.

(4) The area consumption, power consumption, speed and cost of the bridge in the method for storing data of the present embodiment are all acceptable.

(5) The keys stored by this method for storing data are more securer than most of the traditional methods, the technology not only prohibits retrieval of the secret by reverse engineering, but also prevents crackers from measuring the bus with a probe.

(6) In the method for storing data of the present embodiment, since the voltage difference between the two juncture points of the bridge is set to a relatively small value, the voltage difference can only be measured by the comparator integrated on the chip and cannot be measured via external comparators, so security is increased.

(7) The process involved in the method for storing data of the present embodiment is compatible with standard CMOS processing, and the block involved can be integrated with other blocks (e.g. MCU) in a single chip.

(8) The method for storing data of the present embodiment do not need an external battery, so this technology has good portability and can be used in a Smartcard, a TPM chip and other security chips.

In addition, optionally, in the present embodiment, the bridge can be the resistance bridge used in the apparatus for storing data of the above embodiment that comprises resistance bridges, the resistance bridge including configuration legs, the configuration legs comprising a fixed resistor and an adjustable resistor connected in series. At step 1201, a bit is represented with the bridge by adjusting the resistance of the adjustable resistor of the configuration legs of each bridge in order to change the nonequilibrium state (i.e., voltage difference) between two juncture points of the bridge. Preferably, the adjustable resistor comprises a plurality of configuration resistors connected in parallel, and the configuration resistors are connected in parallel with switches. At step 1201, the resistance of the adjustable resistors is changed by controlling the switches.

In the resistance bridge, the switch can be a fuse, whereby at step 1201 the nonequilibrium state of the bridge is adjusted by melting the fuse to control the switch.

Optionally, the switch can be a field effect transistor (FET) switch, or more preferably, a metal oxide semiconductor field effect transistor (MOSFET) switch. At step 1201 for the FET or MOSFET embodiment, the nonequilibrium state of the bridge is adjusted by controlling the on/off of the FET or MOSFET switch through a control unit. The detailed adjusting process is similar to that described above in conjunction with FIG. 9.

In the method for storing data of the present embodiment, a nonequilibrium state of a resistance bridge is used to store '0' and '1'. In the resistance bridge, the resistance of a resistor not only depends on its width and length, but also depends on its thickness and figure. Since the thickness and the effect of figure are difficult to measure, and the thickness varies at different positions on a chip, it is almost impossible for crackers to decide the state of the bridge through a photograph of the layout.

Figure 13:
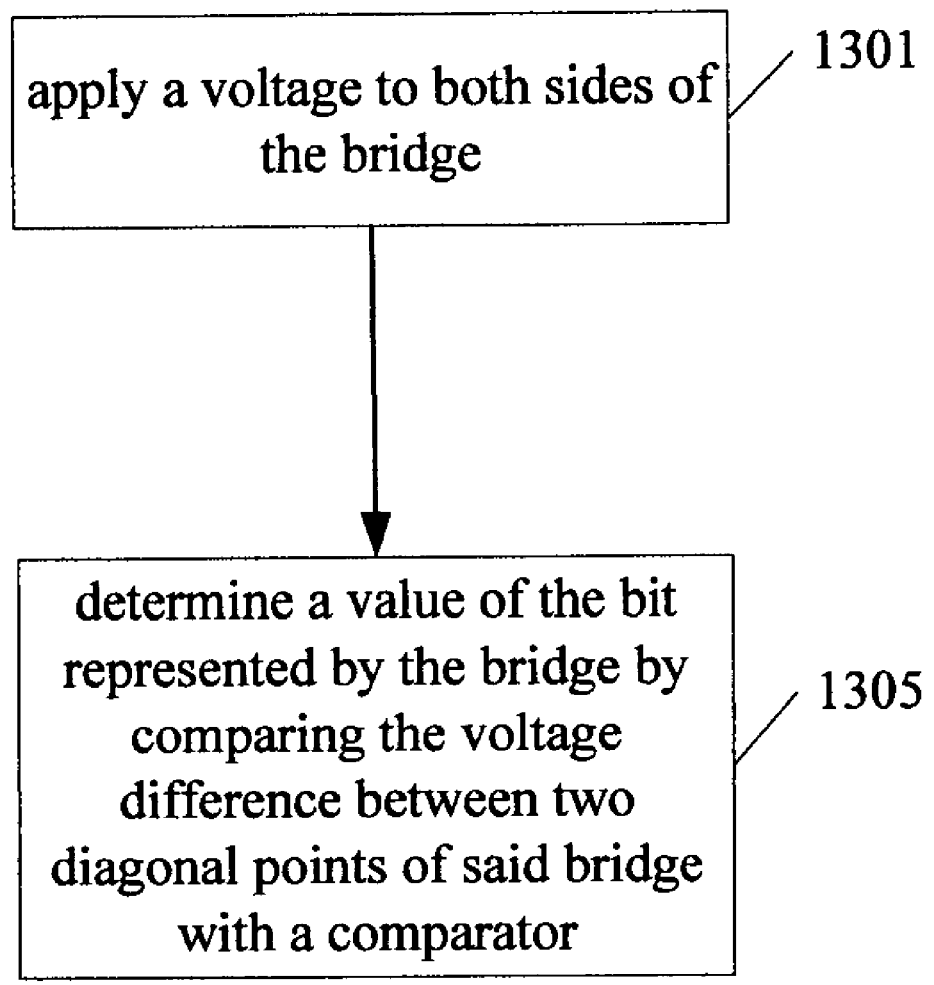
FIG. 13 shows a flowchart of a method for reading data according to one embodiment of the invention.

Under the same inventive conception, FIG. 13 is a flowchart of a method for reading data from an apparatus for storing data according to another embodiment of the invention, wherein the apparatus for storing data is the apparatus for storing data of the above embodiment of the invention. Next, the embodiment will be described in conjunction with FIG. 13.

As shown in FIG. 13, first at step 1301, a voltage (e.g., 2.5V-5V, preferably, 3V-3.3V) is applied to both sides of each bridge.

Next, at step 1305, a value of the bit represented by the bridge is determined by comparing the voltage difference between the two juncture points of each bridge with a comparator.

In particular, as described with reference to the embodiment of FIG. 5, at that step, the voltage difference between the two juncture points of each bridge is compared by the comparator. The bridge represents '0' if the voltage difference of the bridge falls within a first threshold range [−0.3 mV, −0.15 mV], and the bridge represents '1' when the voltage difference of the bridge falls within a second threshold range [0.15 mV, 0.3 mV]. In addition, the threshold ranges corresponding to '0' and '1' are interchangeable.

The various advantages of the above apparatus for storing data can be obtained by using the method for reading data of the present embodiment that use bridges to read keys, as detailed above, and need not be repeated herein.

Although an apparatus and method for storing data and a method for reading data have been described in detail through some exemplary embodiments, these embodiments are not exhaustive. Variations and modifications can be made therein by those skilled in the art without departing from the spirit and scope of the invention. Therefore, the present invention is not limited to these embodiments, the scope of which is only defined by the accompanying claims.

The invention claimed is:

1. An apparatus for storing data, comprising:
    at least one bridge for storing binary data, wherein each bridge has four legs comprising two pair of two legs, the two legs being connected by lines having juncture points, and wherein each bridge represents a bit with a nonequilibrium state between two juncture points; and
    at least one comparator respectively connected between said two juncture points of each of said at least one bridge for determining a value of said bit represented by said bridge.

2. The apparatus for storing data of claim 1, wherein said bridge is a capacitive bridge.

3. The apparatus for storing data of claim 2, wherein said capacitive bridge comprises a configuration leg, said configuration leg includes a fixed capacitor and an adjustable capacitor connected in parallel.

4. The apparatus for storing data of claim 3, wherein said adjustable capacitor includes a plurality of configuration capacitors connected in parallel, each of which is connected in series with a switch.

5. The apparatus for storing data of claim 1, wherein said bridge is a resistance bridge.

6. The apparatus for storing data of claim 5, wherein said resistance bridge comprises a configuration leg, said configuration leg includes a fixed resistor and an adjustable resistor connected in series.

7. The apparatus for storing data of claim 6, wherein said adjustable resistor includes a plurality of configuration resistors connected in series, each of which is connected in parallel with a switch.

8. The apparatus for storing data of claim 4, wherein said switch comprises a fuse, wherein the nonequilibrium state of said bridge is adjusted by melting said fuse to control said switch in order to write data.

9. The apparatus for storing data of claim 4, further comprises a control unit for adjusting the nonequilibrium state of said bridge by controlling said switch in order to write data.

10. The apparatus for storing data of claim 9, further comprises a random number generator for randomly turning off or turning on said switch through said control unit.

11. A method for storing data, comprising:
representing a bit of binary data with a nonequilibrium state of a bridge; and
determining a value of said bit represented by said bridge by comparing the nonequilibrium state of said bridge with a comparator.

12. The method for storing data of claim 11, wherein said bridge is a capacitive bridge, said capacitive bridge comprises a configuration leg, said configuration leg includes a fixed capacitor and an adjustable capacitor connected in parallel, wherein the nonequilibrium state of said bridge is adjusted by changing a capacitance of the adjustable capacitor in the bridge in order to represent a bit of the binary data.

13. The method for storing data of claim 12, wherein said adjustable capacitor includes a plurality of configuration capacitors connected in parallel, each of which is connected in series with a switch, wherein the capacitance of said adjustable capacitor is changed by controlling said switch.

14. The method for storing data of claim 13, wherein said switch comprises a fuse, wherein the nonequilibrium state of said bridge is adjusted by melting said fuse to control said switch.

15. The method for storing data of claim 13, wherein said switch comprises field effect transistor switch, wherein the on/off of said field effect transistor switch is controlled by a control unit to adjust the nonequilibrium state of said bridge.

16. The method for storing data of claim 11, wherein said bridge is a resistance bridge, said resistance bridge comprises a configuration leg, said configuration leg includes a fixed resistor and an adjustable resistor connected in series, wherein the nonequilibrium state of said bridge is adjusted by changing a resistance of the adjustable resistor in the bridge in order to represent a bit of the binary data.

17. The method for storing data of claim 16, wherein said adjustable resistor includes a plurality of configuration resistors connected in series, each of which is connected in parallel with a switch, wherein the resistance of said adjustable resistor is changed by controlling said switch.

18. The method for storing data of claim 17, wherein said switch comprises a fuse, wherein the nonequilibrium state of said bridge is adjusted by melting said fuse to control said switch.

19. The method for storing data of claim 17, wherein said switch comprises field effect transistor switch, wherein the on/off of said field effect transistor switch is controlled by a control unit to adjust the nonequilibrium state of said bridge.

20. A method for reading data from an apparatus for storing data, said apparatus for storing data comprising at least one bridge for storing binary data, wherein each bridge has four legs comprising two pair of two legs, the two legs being connected by lines having juncture points, and wherein each bridge represents a bit with a nonequilibrium state between two juncture points and at least one comparator respectively connected between said two juncture points of each of said at least one bridge for determining a value of said bit represented by said bridge, said method comprising the steps of:
applying a voltage to both sides of said bridge; and
determining a value of the bit represented by said bridge by comparing the voltage difference between said two juncture points of said bridge with said comparator.

* * * * *